United States Patent
Koricic et al.

(10) Patent No.: US 10,720,517 B2
(45) Date of Patent: Jul. 21, 2020

(54) HORIZONTAL CURRENT BIPOLAR TRANSISTOR WITH FLOATING FIELD REGIONS

(71) Applicants: Marko Koricic, Zagreb (HR); Tomislav Suligoj, Zagreb (HR)

(72) Inventors: Marko Koricic, Zagreb (HR); Tomislav Suligoj, Zagreb (HR)

(73) Assignee: University of Zagreb Faculty of Electrical Engineering and Computing, Zagreb (HR)

( * ) Notice: Subject to any disclaimer, the term of this patent is extended or adjusted under 35 U.S.C. 154(b) by 111 days.

(21) Appl. No.: 16/162,643

(22) Filed: Oct. 17, 2018

(65) Prior Publication Data
US 2019/0115456 A1  Apr. 18, 2019

Related U.S. Application Data

(60) Provisional application No. 62/573,273, filed on Oct. 17, 2017.

(51) Int. Cl.
*H01L 29/735* (2006.01)
*H01L 29/737* (2006.01)
(Continued)

(52) U.S. Cl.
CPC ........ *H01L 29/735* (2013.01); *H01L 27/0623* (2013.01); *H01L 27/082* (2013.01);
(Continued)

(58) Field of Classification Search
CPC . H01L 29/735; H01L 27/0623; H01L 29/737; H01L 27/082; H01L 29/1008;
(Continued)

(56) References Cited

U.S. PATENT DOCUMENTS 7,038,249 B2    5/2006  Suligoj et al.
9,899,477 B2 *  2/2018  Turner ................ H01L 29/402
(Continued)

OTHER PUBLICATIONS

M. Koričić, J. Žilak and T. Suligoj, "Improving the horizontal current bipolar transistor breakdown voltage by floating field plates," 2017 IEEE Bipolar/BiCMOS Circuits and Technology Meeting (BCTM), Miami, FL, 2017, pp. 130-133. (Year: 2017).*

(Continued)

*Primary Examiner* — John P. Dulka
(74) *Attorney, Agent, or Firm* — Shalini Venkatesh

(57) ABSTRACT

A horizontal current bipolar transistor comprises; an n-hill layer on a substrate, forming a first pn-junction with the substrate; a n+ diffusion layer on the substrate, adjacent to the n-hill layer, forming a n+n junction with the n-hill layer; an intrinsic base layer on the n-hill layer and comprising a portion of a sidewall inclined at an acute angle to the substrate plane, forming a second pn-junction with the n-hill layer; an extrinsic base layer on the n-hill layer, forming a third pn-junction with the n-hill layer, and a p+p junction with the intrinsic base layer; a field limiting region on the n-hill layer, forming a fourth pn-junction with the n-hill layer. The field limiting region is spatially separated from the extrinsic base layer and the n+ diffusion layer. The extrinsic base layer and the field limiting region exhibit substantially equal impurity dopant distribution decay towards the substrate.

24 Claims, 8 Drawing Sheets

(51) Int. Cl.
  *H01L 27/082* (2006.01)
  *H01L 29/10* (2006.01)
  *H01L 27/06* (2006.01)
  *H01L 29/40* (2006.01)
  *H01L 21/8249* (2006.01)

(52) U.S. Cl.
  CPC ........ *H01L 29/1008* (2013.01); *H01L 29/737* (2013.01); *H01L 21/8249* (2013.01); *H01L 29/402* (2013.01)

(58) Field of Classification Search
  CPC . H01L 21/8249; H01L 29/402; H01L 29/404; H01L 29/0821; H01L 29/401; H01L 29/0619
  See application file for complete search history.

(56) References Cited

U.S. PATENT DOCUMENTS

| | | | |
|---|---|---|---|
| 2005/0040495 A1* | 2/2005 | Suligoj | H01L 29/1008 257/557 |
| 2010/0001352 A1* | 1/2010 | Tsutsui | H01L 21/823418 257/408 |
| 2012/0299053 A1* | 11/2012 | Mauder | H01L 29/0615 257/139 |
| 2014/0042530 A1* | 2/2014 | Cho | H01L 29/0619 257/330 |
| 2017/0098705 A1* | 4/2017 | Harrington | H01L 29/7811 |
| 2017/0179220 A1* | 6/2017 | Koricic | H01L 29/063 |
| 2017/0250255 A1* | 8/2017 | Siemieniec | H01L 29/4236 |
| 2017/0250256 A1* | 8/2017 | Siemieniec | H01L 29/7811 |
| 2018/0061937 A1* | 3/2018 | Tutuc | H01L 21/2253 |
| 2019/0287962 A1* | 9/2019 | Naito | H01L 27/0635 |
| 2019/0288060 A1* | 9/2019 | Naito | H01L 29/7397 |

OTHER PUBLICATIONS

J.A. Appels, and H.M.J Vaes, "High Voltage Thin Layer Devices (RESURF Devices)," in IEDM Tech. Dig., 1979, pp. 238-241.).
H. Kondo, and Y. Yukimoto, "A New Bipolar Transistor—GAT," IEEE Trans. Electron Devices, vol. 27, No. 2, pp. 373-379, Feb. 1980.
J. Cai, M. Kumar, M. Steigenvalt, H. Ho, K. Schonenberg, K. Stein, H. Chen, K. Jenkins, Q. Ouyang, P. Oldiges, and T. Ning, "Vertical SiGe-Base Bipolar Transistors on CMOS-Compatible SOI Substrate", BCTM 2003, pp. 215-218.
T. Suligoj, P. Biljanovic, J.K.O. Sin, K. L. Wang. "A New HCBT with a Partially Etched Collector",IEEE Electron Dev. Letters, vol. 26, No. 3, pp. 200-202, Mar. 2005.
T. Suligoj, M. Koricic, H. Mochizuki, S. Morita, K. Shinomura and H. Imai, "Horizontal Current Bipolar Transistor With a Single Polysilicon Region for Improved High-Frequency Performance of BiCMOS ICs," in IEEE Electron Device Lett., vol. 31, No. 6, pp. 534-536, Jun. 2010.
M. Koričić, T. Suligoj, H. Mochizuki, S. Morita, K. Shinomura, and H. Imai, "Double-Emitter HCBT Structure—A High-Voltage Bipolar Transistor for BiCMOS Integration,", IEEE Trans. Electron Devices, vol. 59 , No. 12 pp. 3647-3650, Dec. 2012.
M. Koričić, J. Žilak and T. Suligoj, "Double-Emitter Reduced-Surface-Field Horizontal Current Bipolar Transistor With 36 V Breakdown Integrated in BiCMOS at Zero Cost," in IEEE Electron Device Lett., vol. 36, No. 2, pp. 90-92, Feb. 2015.
W. Sung, B.J. Baliga, "A Comparative Study 4500-V Edge Termination Techniques for SiC Devices,", IEEE Trans. Electron Devices, vol. 64 , No. 4 pp. 1647-1652, Apr. 2017.

* cited by examiner

HORIZONTAL CURRENT BIPOLAR TRANSISTOR WITH FLOATING FIELD REGIONS

BACKGROUND

This invention relates, in general, to high-voltage bipolar transistor structures, and more particularly to a high-voltage (HV) Horizontal Current Bipolar Transistor which uses the floating field regions for the improvement of breakdown voltages.

HV transistors are very useful components in applications where higher power or higher voltage swings are required. In general, the addition of HV transistors extends the range of applications for the technology. In high-voltage bipolar transistors, the open-base also known as the collector-emitter breakdown voltage ($BV_{CEO}$) presents a more stringent constraint since it is usually 2 to 3 times lower than the open-emitter breakdown voltage ($BV_{CBO}$). The usual approach to obtain the higher breakdown voltages in bipolar transistors is to use lower collector doping concentration in order to reduce the electric field at the base-collector junction. In that case the critical electric field for junction avalanche is achieved for higher voltages applied at the collector terminal. The mainstream bipolar technologies are based on vertical bipolar transistor structures. If the HV vertical bipolar transistors are fabricated together with high-speed (HS) transistors, additional lithography masks and ion implantation steps are required for fabrication of HV and HS collector regions, which increases the cost of the technology. The other approach to obtain the higher $BV_{CEO}$ is to use some form of reduced-surface-field (RESURF) effect (see Table 1, items [1]-[3]) in order to shape the potential distribution and the electric field in the base-collector depletion region. This approach is particularly suitable for lateral bipolar transistors (LBTs) since their geometry can be easily manipulated by the lithography mask design.

The Horizontal Current Bipolar Transistor (HCBT) technology is demonstrated in U.S. Pat. No. 7,038,249 (see Table 1, item [4]). HCBT has a lateral arrangement of the intrinsic transistor, in the same way as LBTs. However, the intrinsic transistor is processed on the sidewall of the silicon pillar or hill, obtained by etching, making it possible to have the optimized doping profiles in the intrinsic transistor. HCBT electrical characteristics are comparable to the characteristics of vertical bipolar transistors, with a considerable improvement over the LBTs, as has been reported in the literature (see Table 1, item [5]).

HCBT is integrated with standard 180 nm CMOS in a very simple process flow resulting in a low cost BiCMOS technology (see Table 1, item [6]). High voltage HCBTs are added to the technology at zero-cost (see Table 1, items [7], [8]). Higher $BV_{CEO}$ is obtained by the collector charge sharing and by the shaping of the electric field in the base-collector depletion region. In a double-emitter (DE) HCBT reported in (see Table 1, item [7]), the geometry manipulation by the lithography mask design is used to obtain a fully depleted collector and to create a drift region which shields the intrinsic base-collector junction. In this way peak electric fields at the extrinsic base-collector junction and at the end of the drift region are responsible for the transistor breakdown. $BV_{CEO}$ is increased from 3.4 V in case of standard high-speed single-emitter (SE) HCBT to 12.6 V in case of DE HCBT.

In this invention we report the usage of floating field regions to limit the electric field at the base-collector junction and at the end of the drift region, which further improves the breakdown voltages of HCBT structures. Floating field rings are used for junction termination of power semiconductor devices (see Table 1, item [9]). Here we use term floating field regions because they are not fabricated to encircle the device in form of a ring. They are fabricated in form of the stripes which form planar pn junctions. This approach can be applied to DE HCBT whose cross-sections are shown in FIGS. 1A and 1B, but also to single-emitter HS HCBT whose cross-section is shown in FIG. 2. In the case of SE HCBT, the lower collector doping concentration compared to DE HCBT is used. This approach is suitable for integration with CMOS since no additional processing is needed for fabrication of proposed devices.

DESCRIPTION OF SYMBOLS USED IN FIGURES

Figure 1A:
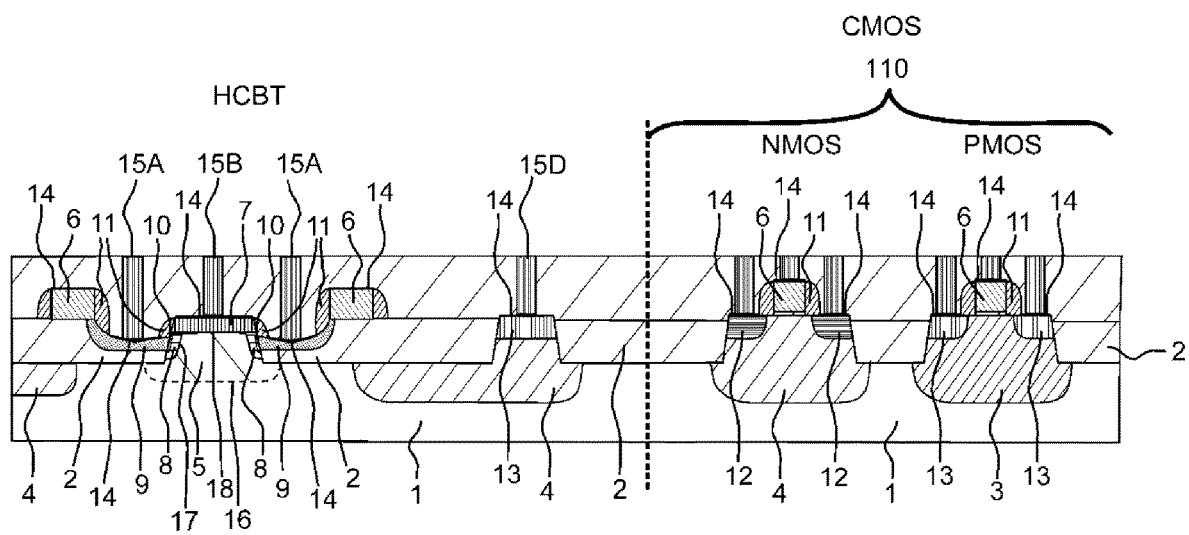
FIG. 1A: Schematic cross-section view at one position of a Double-Emitter HCBT.

1: Substrate
2: Shallow trench isolation (device isolating oxide film)
3: CMOS nwell
4: CMOS pwell
5: n-hill layer
6: CMOS gate polysilicon
7: Extrinsic base layer
8: Intrinsic base layer
9: Emitter polysilicon
10: Emitter diffusion layer
11: Sidewall spacer
12: n+ diffusion layer
13: p+ diffusion layer
14: Silicide
15A: Emitter contact
15B: Base contact
15C: Collector contact
15D: Substrate contact
15E: Anode contact
16: First metallurgical pn junction
17: Second metallurgical pn junction
18: Third metallurgical pn junction 19A: Fourth metallurgical pn junction
19B: Sixth metallurgical pn junction
19D: Fifth metallurgical pn junction
20A: Field limiting region
20B: Middle floating field region (FFR)
20C: Another middle floating field region (FFR)
20D: Outermost floating field region (FFR)
31: Distance between the extrinsic base layer and the field limiting region
32, 33, 34: Distances between FFRs
35: Distance between the outermost FFR and the n+ diffusion layer
41: Width of the field limiting region
42: Width of the middle FFR
43: Width of another middle FFR
44: Width of the outermost FFR
51: Drift region of DE HCBT
52: Drift region of SE HCBT
80: Potential barrier
110: CMOS transistors

DESCRIPTION OF THE INVENTION

This invention presents the new HCBT structures with high breakdown voltages by utilizing the floating field regions (FFRs) for the shaping of the electric field in the base-collector depletion region. This principle is similar to the one used for junction termination in semiconductor power devices (see Table 1, item [9]). The principle can be applied to the DE HCBT as well as SE HCBT. All proposed structures are integrated into HCBT BiCMOS process and are fabricated together with the CMOS transistors 110 as shown in the FIGS. 1-6.

HCBT is fabricated in bulk silicon p-type wafers with the acceptor concentration around $10^{15}$ cm$^{-3}$. With this doping concentration in the substrate it is difficult to deplete n-hill layer (i.e., HCBT's intrinsic collector) which has the concentration on the order of $10^{17}$ cm$^{-3}$. In order to have efficient depletion action, the region of opposite conductivity type with the concentration on the same order of magnitude as in the n-hill layer or higher is needed. The extrinsic base doping of HCBT has a suitable concentration and the same ion implantation can be used to form the FFRs. Moreover, since the distance between the extrinsic base layer and the FFR as well as between the following FFRs are critical for the electric field shaping, this offers the best possible control since they are fabricated with the same mask and the same process steps. In case of DE HCBT collector has the steep profile with decaying concentration towards the substrate. The peak concentration in the n-hill layer is on the order of $10^{17}$ cm$^{-3}$. In order to obtain full depletion of the n-hill layer in case of the SE HCBT, peak concentration should be between $10^{16}$ cm$^{-3}$ and $5.10^{16}$ cm$^{-3}$, which can easily be determined by anyone with skill in the art.

The FFRs can be fabricated by using any doping process which produces the opposite conductivity type of HCBT's n-hill layer. In case of npn HCBT which is integrated with CMOS this could be realized by p+ source/drain implants but it offers less control compared to the extrinsic base implant due to possible mask misalignment.

The First Embodiment

In the first embodiment FFRs are used to change the electric field distribution of the DE HCBT. In DE HCBT the intrinsic collector is fully depleted before the electric field at the intrinsic base-collector junction reaches the critical value, which improves the $BV_{CEO}$.

Figure 3A:
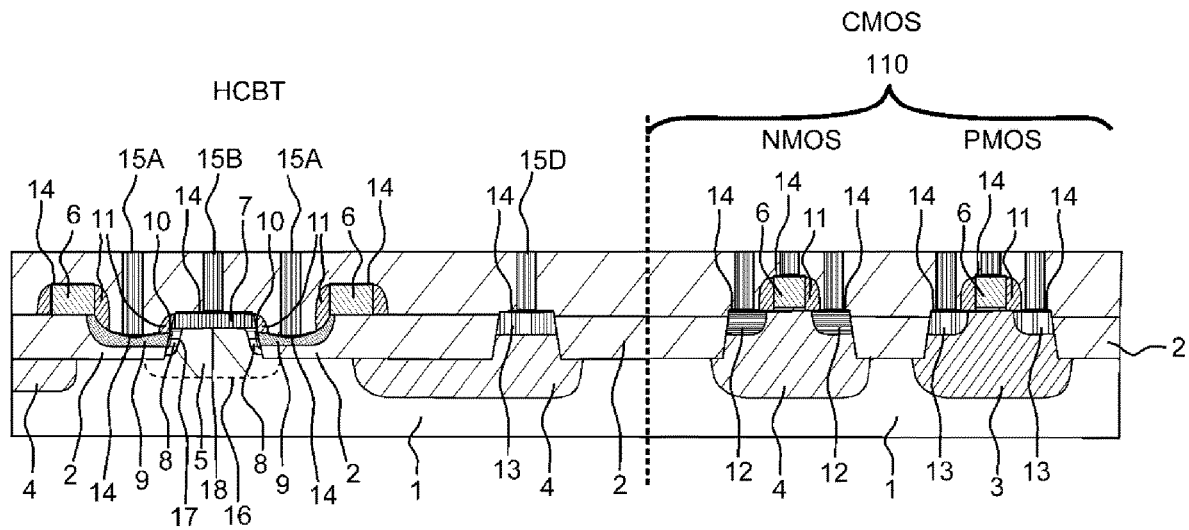
FIG. 3A: Schematic cross-section view at one position of a Double-Emitter HCBT with Floating Field regions according to one embodiment.
Figure 3B:
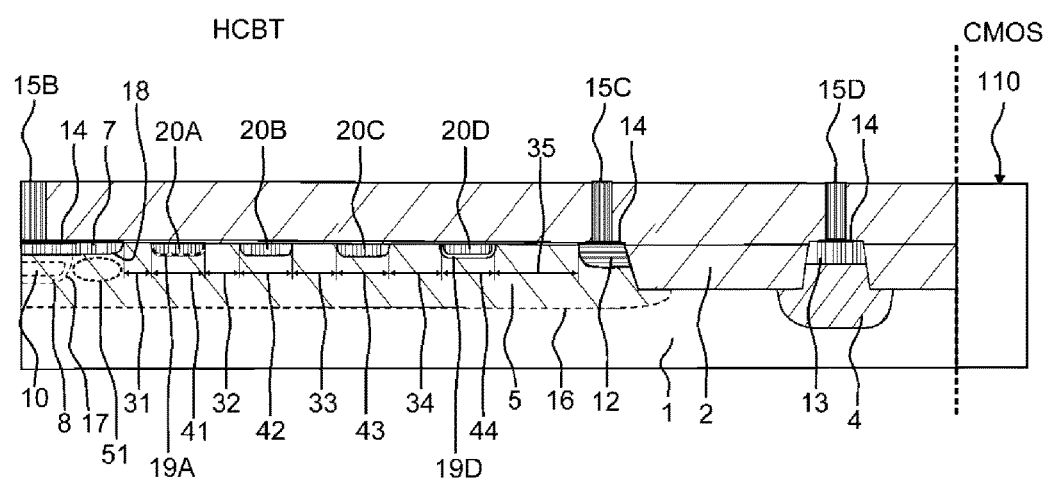
FIG. 3B: Schematic cross-section view at another position of a Double-Emitter HCBT with Floating Field regions according to one embodiment.

Intrinsic part of the proposed structure is the same as in standard DE HCBT from FIG. 1A and is shown again in FIG. 3A. Cross-section cuts the structure along the symmetry line through the middle of the emitters (EBE cross-section). Another cross-section cuts the structure along the other symmetry line through the middle of the n-hill (BC cross-section) and is shown in FIG. 3B. Since the structure is symmetrical with respect to the base contact, only one half is shown.

Structure is fabricated in the silicon substrate 1, on the sidewall of islands obtained by shallow trench isolation (STI). The islands are doped in order to obtain n-hill layer 5. The substrate 1 and the n-hill layer 5 form the first metallurgical pn-junction 16. Transistor is fabricated on two opposing sidewalls where two emitter diffusion layers 10 and two intrinsic base layers 8 are created. Emitters are diffused from the emitter polysilicon 9, which is electrically connected to the emitter contacts 15A via silicide 14. The intrinsic base layer 8 and the n-hill layer 5 form the second metallurgical pn-junction 17. An extrinsic base layer 7 is implanted on top of the structure. The extrinsic base layer 7 and the n-hill layer 5 form the third metallurgical pn-junction 18, whereas the extrinsic base layer 7 and the intrinsic base layers 8 form metallurgical p+p junction. The extrinsic base layer 7 is extended laterally over the intrinsic base layer 8 in the direction of the n+ diffusion layer 12 (see FIG. 3B). We can use isometric projections on the wafer plane parallel to substrate, to define these extrinsic base extensions. Therefore, the isometric projection of the extrinsic base layer 7 on the wafer plane not intercepted with isometric projection of the intrinsic base layer 8 on the wafer plane consists of at least one polygon having finite area larger than zero. The n+ diffusion layer 12 provides a low resistance ohmic connection to the collector contact 15C via silicide 14. The n-hill layer 5 in cross-section from FIG. 3A is surrounded by the intrinsic base layer 8 from two sides, which is the most important for its full depletion (see Table 1, item [7]). The amount of n-hill layer charge in the cross-section from FIG. 3A depends on the distance between two opposing intrinsic base layers 8, which is controlled by the lithography masks. In forward active mode of operation the 1st metallurgical pn junction 16, the 2nd metallurgical pn junction 17 and the 3rd metallurgical pn junction 18 are reverse biased and the depletion region spreads on the n-hill layer side. After full depletion of the n-hill layer in the cross-section from FIG. 3A, the drift region of DE HCBT 51 is formed laterally with respect to the emitters toward the n+ diffusion layer 12 (see FIG. 3B). The peak electric field at the 2nd metallurgical pn-junction 17 remains constant, whereas the peaks at the end of the drift region of DE HCBT 51 and at the part of the 3rd metallurgical pn-junction 18 rise with the increase in the collector voltage causing the breakdown eventually.

Figure 1B:
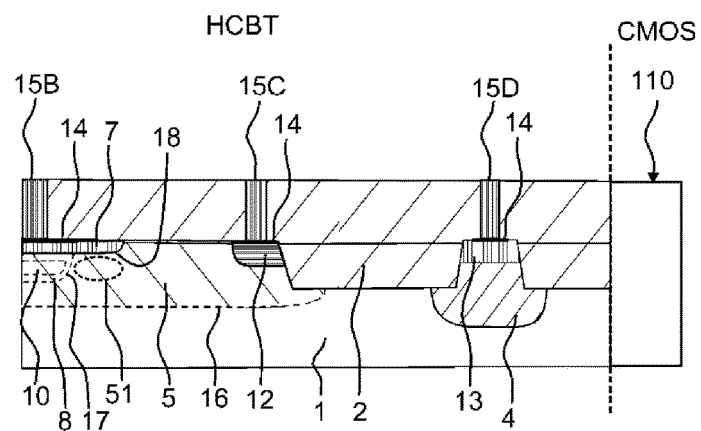
FIG. 1B: Schematic cross-section view at another position of a Double-Emitter HCBT.
Figure 2:
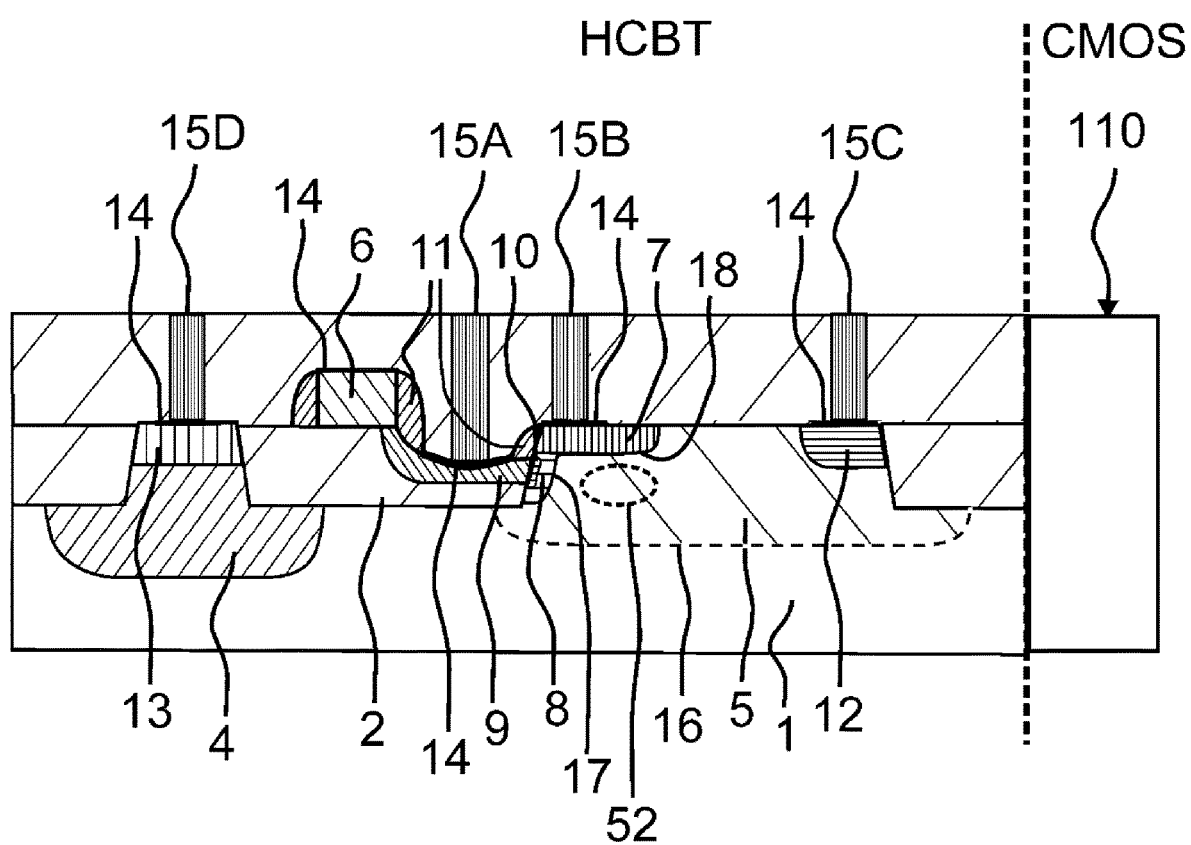
FIG. 2: Schematic cross-section view of a Single-Emitter HCBT.

Comparing the FIGS. 1B and 3B, we can observe that in case of the proposed HCBT structures, one field limiting region 20A and, optionally, additional FFRs 20B~D are placed between the extrinsic base layer 7 and the n+ diffusion layer 12 of DE HCBT. They can be obtained by using the same lithography mask and ion implantation that is used for the extrinsic base layer fabrication. The field limiting region 20A and FFRs 20B~D are then implanted together with the extrinsic base layer 7, which offers the best possible control of the electric field at the third metallurgical pn-junction 18 and in the drift region of DE HCBT 51 below the extrinsic base layer. At least the field limiting region 20A should be used for the improvement of breakdown voltages. In FIG. 3B an outermost FFR 20D and two middle FFRs 20B and 20C are shown. More middle FFRs can be added in order to further increase the breakdown voltages. The field limiting region 20A and the n-hill layer 5 form the 4th metallurgical pn-junction 19A, whereas the outermost FFR 20D and the n-hill layer 5 form the 5th metallurgical pn-junction 19D.

In the first embodiment, the field limiting region 20A is on the floating potential. The space charge in the part of the n-hill layer between the extrinsic base layer 7 and the field limiting region 20A is limited and depends on the distance between the extrinsic base layer and the field limiting region 31. When collector voltage is increased, the part of the n-hill layer 5 between the extrinsic base layer 7 and the field limiting region 20A is fully depleted (i.e. is in punch-through). The floating potential of the field limiting region 20A is pinned and is equal to the extrinsic base potential increased by the voltage drop across the punchthrough region. Once potential of the field limiting region 20A is set, further increase in the collector voltage causes the reverse polarization of the 4th metallurgical pn-junction 19A. Now, the field limiting region 20A can act as the field plate and be used to fully deplete the part of the n-hill layer below and to form an additional drift region. The additional drift region then limits and shields the electric field peaks at the 3rd metallurgical pn-junction 18 and at the end of the drift region of DE HCBT 51. Further increase in the collector voltage increases the peak electric field at the 4th metallurgical pn-junction 19A and at the end of the drift region below field limiting region 20A. In the case where only one field limiting region, 20A, is disposed next to the extrinsic base layer 7, the collector-emitter breakdown voltage can be improved if full depletion of the n-hill layer 5 is accomplished prior to the onset of the breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18) and from the 1st (16) to the 4th (19A).

Figure 7:
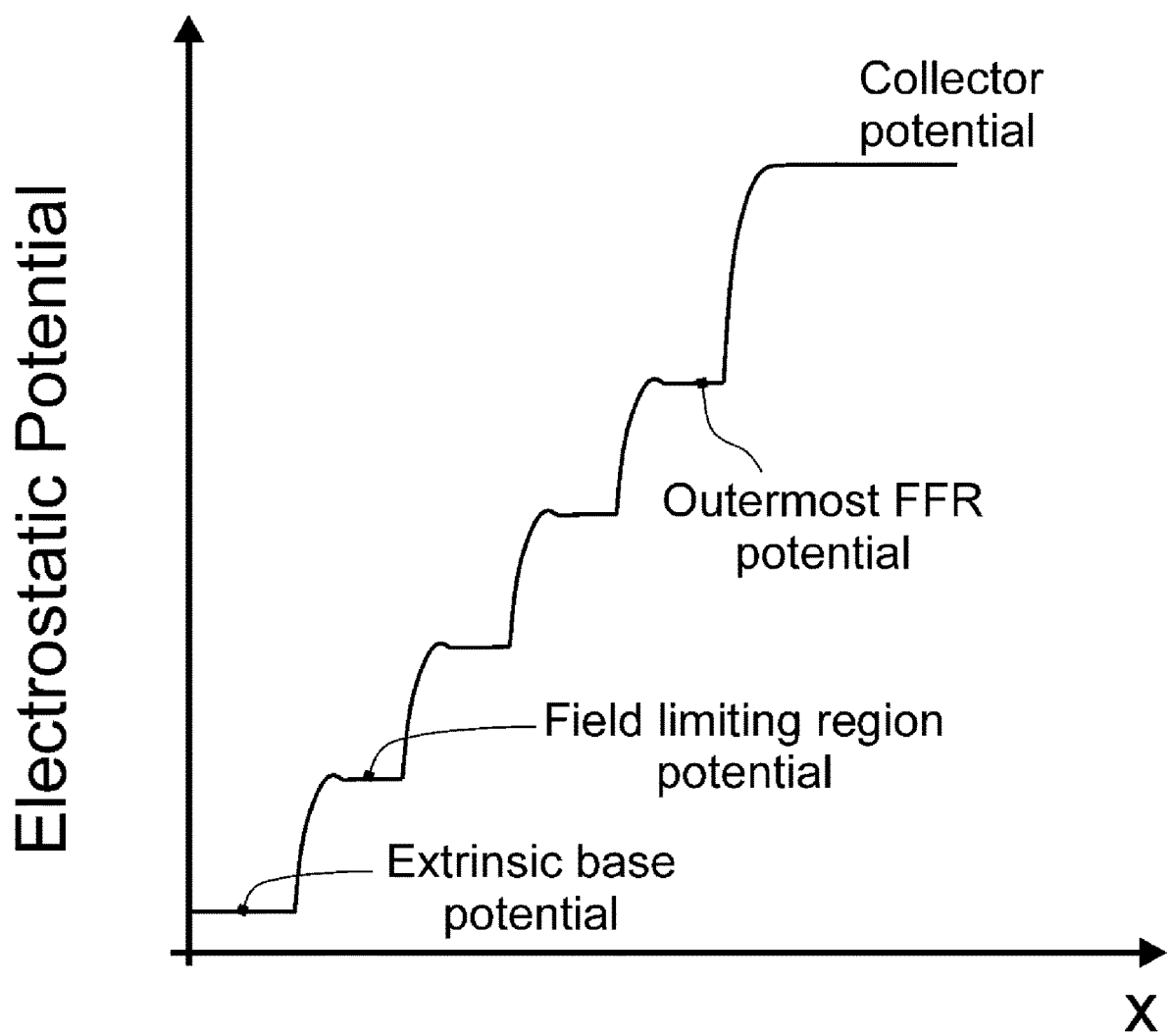
FIG. 7: Electrostatic potential distribution at one position of the transistor according to some embodiments.

Using the same principle, further increase of the breakdown voltage can be obtained by using additional FFRs which introduce the same number of drift regions. In FIG. 3B the additional FFRs are one outermost FFR 20D and two middle FFRs 20B and 20C. At least the outermost FFR 20D should be used to further improve breakdown voltage. In case of full depletion of the n-hill layer below FFRs, depletion region spreads from the 3rd metallurgical pn-junction 18 to the 5th metallurgical pn-junction 19D. This should occur prior to the onset of the collector-emitter breakdown. Therefore, in cases where the field limiting region 20A and additional floating field regions 20B~D are disposed next to the extrinsic base layer 7, the collector-emitter breakdown voltage can be improved if full depletion of the n-hill layer 5 is accomplished prior to the onset of breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18), and from the 1st (16) to the 4th (19A), and from the 3rd (18) to the 5th (19D) and from the 1st (16) to the 5th (19D). In case of the full depletion of the n-hill layer, the potential of each FFR is set by the potential of the previous FFR increased by the punchthrough voltage needed for full depletion of the part of the n-hill layer between two neighbor FFRs. Potential distribution near the top silicon surface across the extrinsic base layer, the field limiting region and the additional FFRs is shown in FIG. 7. Peak electric fields at the 5th metallurgical pn-junction 19D and in the drift region below the outermost FFR 20D can reach the critical value since charge is not limited there. It is shown as the higher voltage drop between the outermost FFR and the collector in FIG. 7. Avalanche electrons flow to the collector which is on the highest potential and avalanche holes flow to the outermost FFR 20D, which is on lower potential, and from there gradually towards the extrinsic base layer 7, i.e. towards the lowest potential. If the base is driven by a constant base current $I_B$, avalanche holes are injected to the emitter. Due to emitter efficiency, large back injection of electrons occurs, which flow through the intrinsic base layer and the base-collector depletion region. In the depletion region they flow through the area of peak electric field at the end of the outermost drift region and cause the additional impact ionization. The positive feedback loop is closed and the breakdown starts, which is the classical breakdown mechanism of the collector-emitter breakdown.

The width of the field limiting region 41, the widths of FFRs (42, 43 and 44) and distances between them (31, 32, 33 and 34) can be optimized for the best performance regarding the breakdown voltage and the frequency characteristics of the device. The best performance is achieved if the distances 31, 32, 33 and 34 gradually increase moving from the field limiting region 20A toward the outermost FFR 20D. Distance between the outermost FFR and the n+ diffusion layer 35 should be chosen such that the breakdown occurs prior to the full depletion of the n-hill layer between the outermost FFR 20D and the n+ diffusion layer 12. The width of the field limiting region 41 and the widths of FFRs (42, 43 and 44) can be kept the same with smaller widths being favorable for better high frequency performance.

The Second Embodiment

Figure 4:
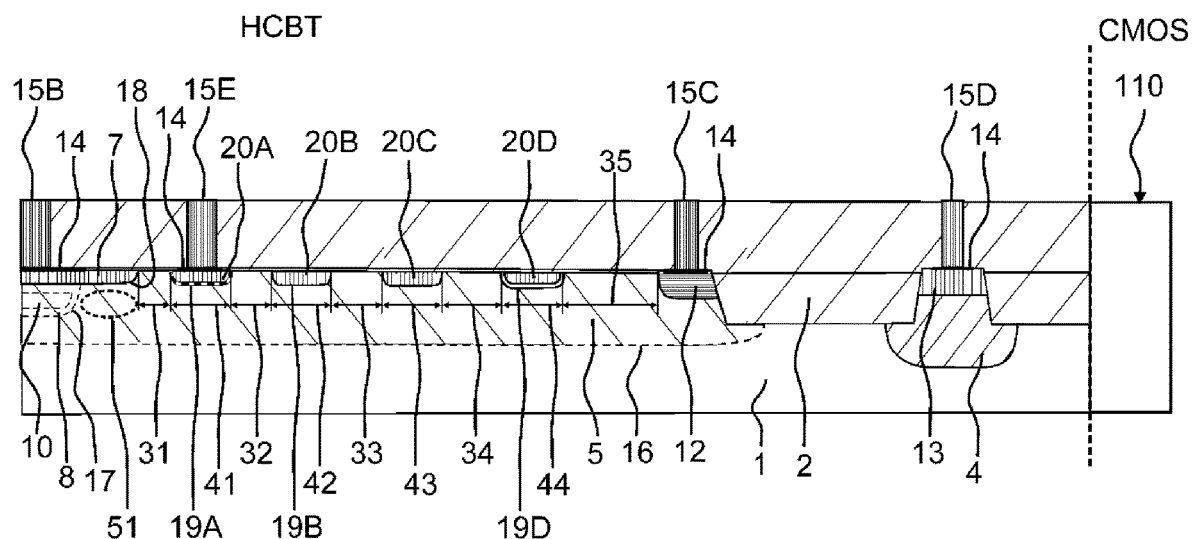
FIG. 4: Schematic cross-section view at one position of a Double-Emitter HCBT with Floating Field regions according to another embodiment.

In the second embodiment presented in FIG. 4, the electric field distribution of the DE HCBT is controlled by the field limiting region connected to the fixed potential and the additional FFRs. The cross-section through the middle of the emitters (EBE cross-section) is the same as in FIGS. 1A and 3A. The structure is similar to the first embodiment where the field limiting region 20A and the additional FFRs 20B~D are placed between the extrinsic base layer 7 and the n+ diffusion layer 12 of DE HCBT. The only difference is that the field limiting region 20A next to the extrinsic base layer 7 has the electrical connection with an anode contact 15E via silicide 14. In this way the potential of the field limiting region 20A can be set to the fixed value. At least the field limiting region 20A should be used for the improvement of breakdown voltages of DE HCBT. In FIG. 4 an outermost FFR 20D, and two middle FFRs 20B and 20C are representing additional FFRs. More middle FFRs can be added in order to further increase the breakdown voltages. The field limiting region 20A and the n-hill layer 5 form the 4th metallurgical pn-junction 19A, the outermost FFR 20D and the n-hill layer 5 form the 5th metallurgical pn-junction 19D and the middle FFR 20B and the n-hill layer 5 form the 6th metallurgical pn-junction 19B.

In the case of npn HCBT, the field limiting region 20A should be connected to the lowest potential. In forward active mode of operation collector is connected to the positive potential. Therefore, the 1st metallurgical pn junction 16, the 2nd metallurgical pn junction 17, the 3rd metallurgical pn junction 18 and the 4th metallurgical pn-junction 19A are reverse biased. Depletion region spreads dominantly on the n-hill layer side. At the certain collector voltage part of the n-hill layer 5 between the extrinsic base layer 7 and the field limiting region 20A is fully depleted as well as the part of the n-hill layer below the field limiting region 20A. In that case peak electric fields at the 3rd metallurgical pn-junction 18 and at the end of the drift region of DE HCBT 51 are limited. When part of the n-hill layer below the field limiting region 20A is fully depleted, additional drift region is formed there. By increasing the collector voltage, peak electric fields appear at the end of that drift region as well as at the 4th metallurgical pn-junction 19A. In cases where only the field limiting region 20A is disposed next to the extrinsic base layer 7, the collector-emitter breakdown voltage can be improved if full depletion of the n-hill layer 5 is accomplished prior to the onset of breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18) and from the 1st (16) to the 4th (19A). The electric field peaks at the 4th metallurgical pn-junction 19A and in the drift region below the field limiting region 20A can be limited by using the additional FFRs, where the FFR closest to the field limiting region 20A is responsible for the limitation of field. At least one FFR should be used to further improve breakdown voltages. In that case it would be the closest FFR to the n+ diffusion layer. Therefore, at least the outermost FFR 20D should be used to further improve breakdown voltages. In the case of full depletion of the n-hill layer below the field limiting region 20A and the additional FFRs, depletion region spreads from the 3rd metallurgical pn-junction 18 to the 5th metallurgical pn-junction 19D. This should occur prior to the onset of the collector-emitter breakdown. Therefore, in cases where the field limiting region 20A and the additional floating field regions 20B~D are disposed next to the extrinsic base layer 7, the collector-emitter breakdown voltage can be improved if full depletion of the n-hill layer 5 is accomplished prior to the onset of breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18), and from the 1st (16) to the 4th (19A), and from the 3rd (18) to the 5th (19D) and from the 1st (16) to the 5th (19D).

Figure 8:
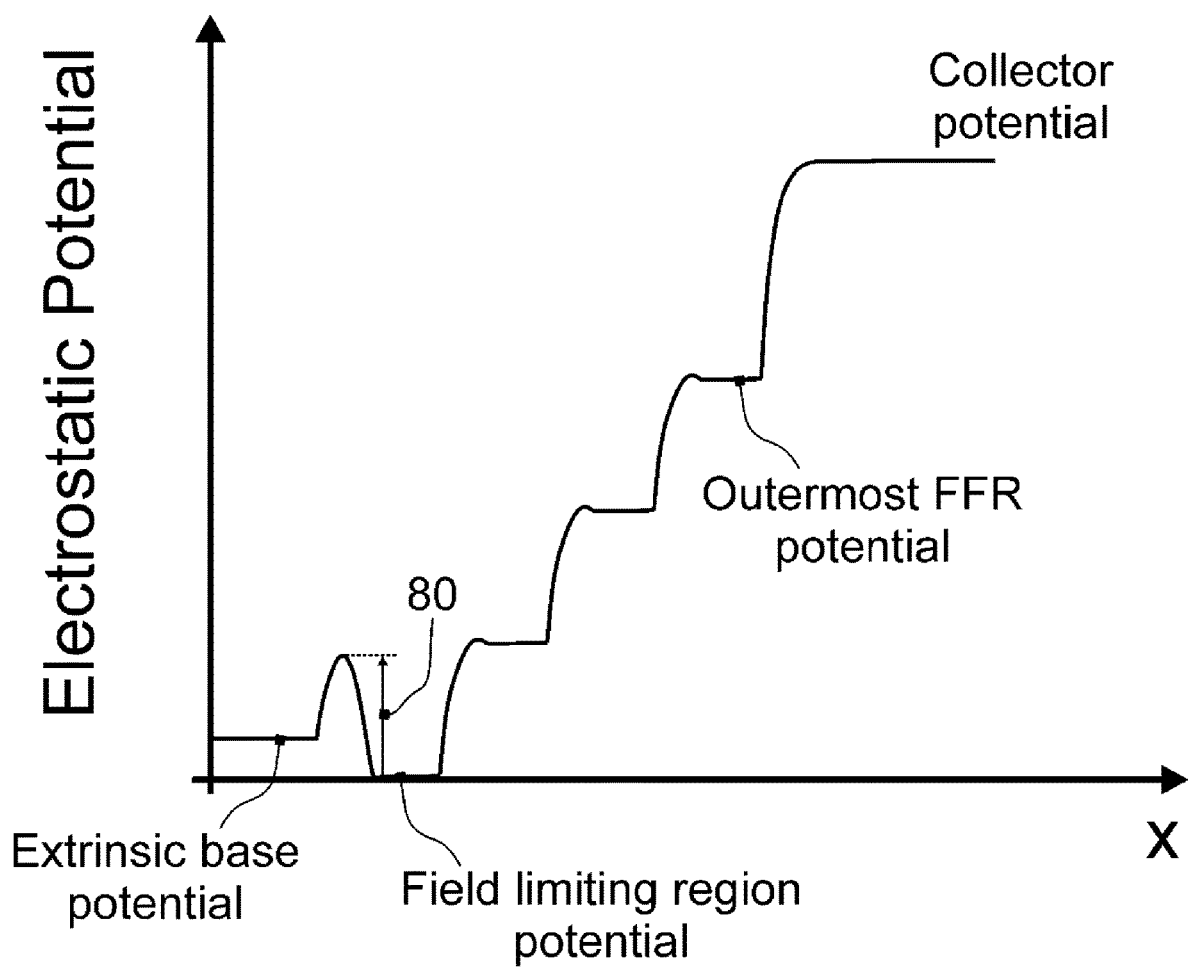
FIG. 8: Electrostatic potential distribution at one position of the transistor according to some other embodiments.

In FIG. 4 the middle FFR 20B is used to limit the electric field peaks associated with the field limiting region 20A. When part of the n-hill layer between field limiting region 20A and the middle FFR 20B is fully depleted (i.e. is in punchthrough), the potential of the middle FFR 20B is set by the potential of field limiting region 20A increased by the voltage drop across fully depleted part of the n-hill layer between the field limiting region 20A and the middle FFR 20B. Once the potential of the middle FFR 20B is set, further increase in the collector voltage causes the reverse polarization of the 6th metallurgical pn-junction 19B and the middle FFR 20B basically serves as a field plate. Part of n-hill layer below the middle FFR 20B is then fully depleted and additional drift region is formed, which limits and shields the peak electric field at the 4th metallurgical pn-junction 19A and at the end of the drift region below the field limiting region 20A. The increase in collector voltage increases the peaks of electric field at the 6th metallurgical pn-junction 19B and in the drift region below the middle FFR 20B. These peaks can be limited and shielded by using the additional FFRs which introduce the same number of drift regions. In case of full depletion of the n-hill layer below FFRs, the depletion region extends all the way from the 3rd metallurgical pn-junction 18 to the 5th metallurgical pn-junction 19D. This should occur prior to the onset of breakdown. The potential of each FFR is then set by the potential of the previous FFR increased by the punchthrough voltage needed for full depletion of the n-hill layer between two neighbor FFRs. Potential distribution near the top silicon surface across the extrinsic base layer, the field limiting region and the additional FFRs is shown in FIG. 8. Peak electric fields at the 5th metallurgical pn-junction and in the drift region below the outermost FFR 20D can reach the critical value since charge is not limited there. It is shown as the higher voltage drop between the outermost FFR and the collector in FIG. 8. Avalanche electrons flow to the collector which is on the highest potential and avalanche holes flow to the outermost FFR 20D, which is on the lower potential, and from there gradually towards the field limiting region 20A and out of the anode contact 15E, i.e. towards the lowest potential. Potential barrier 80 is formed between the field limiting region 20A and the extrinsic base layer 7, which prevents the flow of avalanche holes to the extrinsic base layer 7 and their injection to the emitter. In that case the positive feedback loop is broken and the collector-emitter breakdown voltage $BV_{CEO}$ is improved.

The widths of the floating regions (42, 43 and 44) and distances between them (32, 33 and 34) can be optimized for the best performance regarding the breakdown voltage and the frequency characteristics of the device. The best performance is achieved if the distances 42, 43 and 44 gradually increase moving from the middle FFR 20B toward the outermost FFR 20D. Distance between the outermost FFR and the n+ diffusion layer 35 should be chosen such that the breakdown occurs prior to the full depletion of the n-hill layer between the outermost FFR 20D and the n+ diffusion layer 12. The widths of the FFRs (42, 43 and 44) can be kept the same with smaller widths being favorable for better high frequency performance.

The distance between the extrinsic base layer and the field limiting region 31 should be chosen such that it results in the sufficiently high potential barrier 80 which can be easily determined by anyone with skill in the art. The minimum possible width of the field limiting region 41 is favorable for better high frequency performance.

The Third Embodiment

Figure 5:
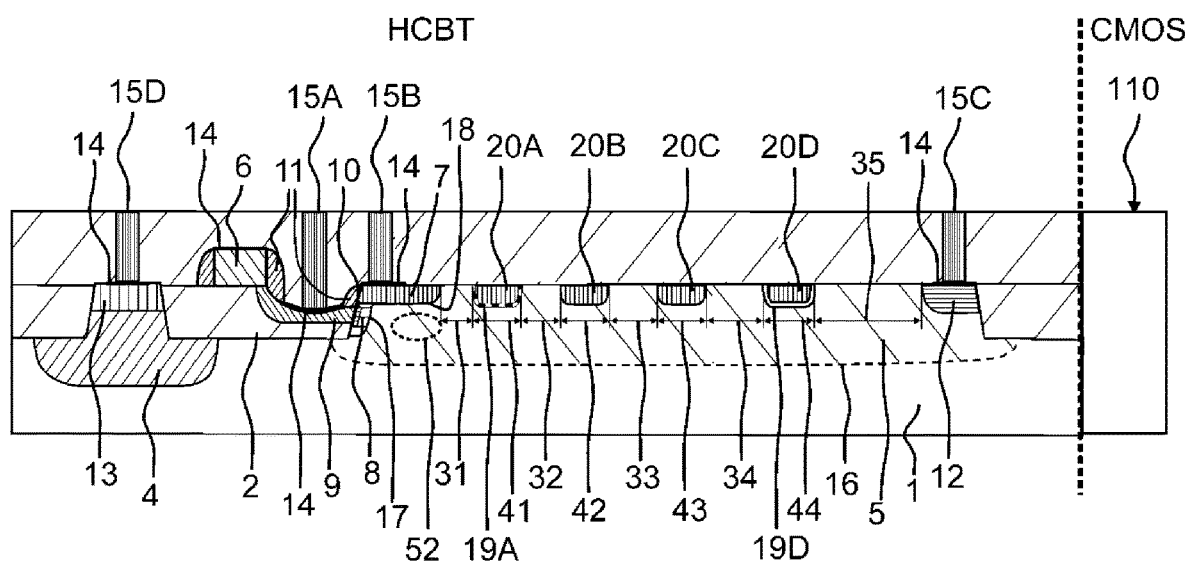
FIG. 5: Schematic cross-section view at one position of a Single-Emitter HCBT with Floating Field regions according to one embodiment.

The FFRs can also be applied to increase the breakdown voltages of single emitter (SE) HCBT as shown in FIG. 5. Compared to the SE HCBT, in proposed structures, the field limiting region 20A and the additional FFRs 20B~D are placed between the extrinsic base layer 7 and the n+ diffusion layer 12 of SE HCBT. Structure is fabricated in the silicon substrate 1, on the sidewall of islands obtained by shallow trench isolation (STI). Islands are doped in order to obtain n-hill layer 5. Substrate 1 and n-hill layer 5 form the first metallurgical pn-junction 16. Transistor is fabricated on one sidewall where emitter diffusion layer 10 and intrinsic base layer 8 are created. Emitter is diffused from the emitter polysilicon 9, which is electrically connected to the emitter contact 15A via silicide 14. Intrinsic base layer 8 and the n-hill layer 5 form the second metallurgical pn-junction 17. Extrinsic base layer 7 is implanted on top of the structure.

Extrinsic base layer 7 and n-hill layer 5 form the third metallurgical pn-junction 18, whereas Extrinsic base layer 7 and intrinsic base layers 8 form metallurgical p+p junction. n+ diffusion layer 12 provides low resistance ohmic connection to the collector contact 15C via silicide 14.

The improvement of the breakdown voltage of SE HCBT by FFRs is feasible if the part of the n-hill layer 5 between the extrinsic base layer 7 and the substrate 1 can be depleted in vertical direction prior to the achievement of the critical electric field at the 2nd metallurgical pn-junction 17. In forward active mode of operation the collector is connected to the higher potential and the 1st metallurgical pn junction 16, the 2nd metallurgical pn junction 17 and the 3rd metallurgical pn junction 18 are reverse polarized and the depletion region spreads on the n-hill layer side. When the n-hill layer 5 between the extrinsic base layer 7 and the substrate 1 is fully depleted, the drift region of SE HCBT 52 is formed below the extrinsic base layer 7 and field at the 2nd metallurgical pn-junction 17 is limited. Peaks at the end of the drift region of SE HCBT 52 and at the 3rd metallurgical pn-junction 18 are formed and are increasing with the collector voltage. In order to achieve the fully depleted n-hill layer prior to the onset of the breakdown, the n-hill layer doping concentration should be lower than in case of the DE HCBT.

In the embodiment presented in FIG. 5, the floating field regions are used in order to limit the electric field at the end of the drift region of SE HCBT 52 and at the curvature of the 3rd metallurgical pn-junction 18 near the top surface. The field limiting region 20A and the additional FFRs 20B~D are placed between the extrinsic base layer 7 and the n+ diffusion layer 12. They can be obtained by using the same lithography mask and ion implantation that is used for the extrinsic base layer 7 fabrication, which offers the best possible control of the electric field at the 3rd metallurgical pn-junction 18 and in the drift region of SE HCBT 52 below the extrinsic base layer 7. At least the field limiting region 20A should be used for the improvement of breakdown voltages, which can be further improved by using the additional FFRs. In FIG. 5 an outermost FFR 20D and two middle FFRs 20B and 20C are shown. More middle FFRs can be added in order to further increase the breakdown voltages. The field limiting region FFR 20A and the n-hill layer 5 form the 4th metallurgical pn-junction 19A, whereas the outermost FFR 20D and the n-hill layer 5 form the 5th metallurgical pn-junction 19D. In the third embodiment, the field limiting region 20A is on the floating potential. The space charge in the part of the n-hill layer 5 between the extrinsic base layer 7 and the field limiting region 20A is limited and depends on the distance between the extrinsic base layer and the field limiting region 31. In forward active mode of operation the 3rd metallurgical pn junction 18 is reverse polarized and the depletion region spreads on the n-hill layer side. Depletion region should spread from the 3rd metallurgical pn junction 18 to 4th metallurgical pn junction 19A prior to the onset of breakdown. In cases where only the field limiting region 20A is disposed next to the extrinsic base layer 7, the collector-emitter breakdown voltage can be improved if full depletion of the n-hill layer 5 is accomplished prior to the onset of the breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18) and from the 1st (16) to the 4th (19A).

Further increase of the breakdown voltages can be obtained by using the additional FFRs, which consists of at least the outermost FFR 20D. If additional FFRs are used, the depletion region should spread from the 3rd metallurgical pn junction 18 to the 5th metallurgical pn junction 19D prior to the onset of breakdown. The electric field shaping and the physics of the breakdown are completely the same as in the first embodiment as well as design considerations for optimum electrical performance. Potential distribution near the top silicon surface across the extrinsic base layer 7, the field limiting region 20A and the additional FFRs 20B~D is shown in FIG. 7. Therefore, in cases where the field limiting region 20A and the additional floating field regions 20B~D are disposed next to the extrinsic base layer 7, the collector-emitter breakdown voltage can be improved if full depletion of the n-hill layer 5 is accomplished prior to the onset of breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18), and from the 1st (16) to the 4th (19A), and from the 3rd (18) to the 5th (19D) and from the 1st (16) to the 5th (19D).

The width of the field limiting region 41, the widths of the floating field regions (42, 43 and 44) and distances between them (31, 32, 33 and 34) can be optimized for the best performance regarding the breakdown voltage and the frequency characteristics of the device. The best performance is achieved if the distances 31, 32, 33 and 34 gradually increase moving from the field limiting region 20A toward the outermost FFR 20D. Distance between the outermost FFR and the n+ diffusion layer 35 should be chosen such that the breakdown occurs prior to the full depletion of the n-hill layer between the outermost FFR 20D and the n+ diffusion layer 12. The width of the field limiting region 41 and the widths of FFRs (42, 43 and 44) can be kept the same with smaller widths being favorable for better high frequency performance.

The Fourth Embodiment

Figure 6:
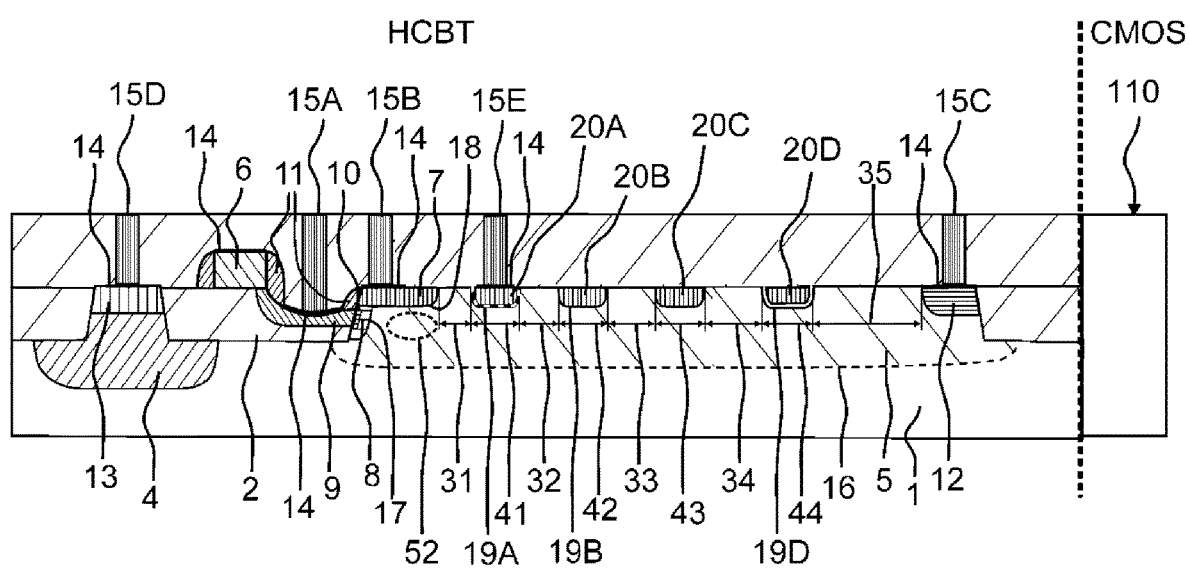
FIG. 6: Schematic cross-section view at one position of a Single-Emitter HCBT with Floating Field regions according to another embodiment

In the fourth embodiment presented in FIG. 6, the electric field distribution of the SE HCBT is controlled by the field limiting region with fixed potential and the additional FFRs. The structure is similar to the third embodiment where field limiting region 20A and the additional FFRs 20B~D are placed between the extrinsic base layer 7 and the n+ diffusion layer 12 of SE HCBT. The only difference is that the field limiting region 20A next to the extrinsic base layer 7 has the electrical connection with the anode contact 15E via silicide 14. In this way the potential of the field limiting region 20A can be set to the fixed value. At least field limiting region 20A should be used to improve breakdown voltage of SE HCBT. In FIG. 6 the additional FFRs consists of the middle FFRs 20B and 20C and the outermost FFR 20D. The field limiting region 20A and the n-hill layer 5 form the 4th metallurgical pn-junction 19A, the outermost FFR 20D and the n-hill layer 5 form the 5th metallurgical pn-junction 19D and the middle FFR 20B and the n-hill layer 5 form the 6th metallurgical pn-junction 19B.

In the case of npn HCBT, the field limiting region 20A should be connected to the lowest potential. In forward active region collector is connected to the positive potential and the 4th metallurgical pn-junction 18 is reverse polarized. It is used to limit the electric field at the drift region of SE HCBT 52 and at the 3rd metallurgical pn-junction 18. When part of the n-hill layer below the field limiting region 20A is fully depleted, additional drift region is formed there and collector-emitter breakdown voltage is improved. In cases where only the field limiting region 20A is disposed next to the extrinsic base layer 7, the collector-emitter breakdown voltage can be improved if full depletion of the n-hill layer 5 is accomplished prior to the onset of the breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18) and from the 1st (16) to the 4th (19A). By increasing the collector voltage, peak electric fields appear at the end of the drift region region below the field limiting region 20A as well as at the 4th metallurgical pn-junction 19A. Those electric field peaks can be limited by using the additional FFRs, where the FFR closest to the field limiting region 20A is responsible for the limitation of field. At least one FFR should be used to further improve breakdown voltages. In that case it would be the closest FFR to the n+ diffusion layer. Therefore, at least the outermost FFR 20D should be used to further improve breakdown voltages. In the case of full depletion of the n-hill layer below the field limiting region 20A and the additional FFRs, depletion region spreads from the 3rd metallurgical pn-junction 18 to the 5th metallurgical pn-junction 19D. This should occur prior to the onset of the collector-emitter breakdown. Therefore, in cases where the field limiting region 20A and the additional floating field regions 20B~D are disposed next to the extrinsic base layer 7, the collector-emitter breakdown voltage can be improved if full depletion of the n-hill layer 5 is accomplished prior to the onset of breakdown. This means that for at least one value of collector-emitter voltage smaller than the collector-emitter breakdown voltage, depletion regions should extend between the following metallurgical pn-junctions: from the 3rd (18) to the 4th (19A), and from the 1st (16) to the 2nd (17), and from the 1st (16) to the 3rd (18), and from the 1st (16) to the 4th (19A), and from the 3rd (18) to the 5th (19D) and from the 1st (16) to the 5th (19D).

In FIG. 6 the middle FFR 20B is used to limit the electric field at the 4th metallurgical pn-junction 19A and in the drift region below the field limiting region 20A. In case of full depletion of the n-hill layer below FFRs, the depletion region extends from the 3rd metallurgical pn-junction 18 to the 5th metallurgical pn-junction 19D. This should occur prior to the onset of breakdown. The electric field shaping and the physics of the breakdown are completely the same as in the second embodiment as well as design considerations for optimum electrical performance. Potential distribution near the top silicon surface across the extrinsic base layer 7, the field limiting region 20A and the additional FFRs 20B~D is shown in FIG. 8.

The widths of the floating regions (42, 43 and 44) and distances between them (32, 33 and 34) can be optimized for the best performance regarding the breakdown voltage and the frequency characteristics of the device. The best performance is achieved if the distances 42, 43 and 44 gradually increase moving from the middle FFR 20B toward outermost FFR 20D. Distance between the outermost FFR and the n+ diffusion layer 35 should be chosen such that the breakdown occurs prior to the full depletion of the n-hill layer between outermost FFR 20D and the n+ diffusion layer 12. The widths of the FFRs (42, 43 and 44) can be kept the same with smaller widths being favorable for better high frequency performance.

The distance between the extrinsic base layer and the field limiting region 31 should be chosen such that it results in the sufficiently high potential barrier 80 (see FIG. 8), which can be easily determined by anyone with skill in the art. The minimum possible width of the field limiting region 41 is favorable for better high frequency performance.

In conclusion, embodiments of the present invention provide many benefits. By adding one or more floating field regions to HCBT structures, the collector-emitter breakdown voltage can be tuned in a way that higher breakdown voltage is obtained for larger number of the additional floating field regions. Placement of the anode contact on top of the field limiting region next to the extrinsic base layer and its connection to the fixed potential, breaks the positive feedback loop of the breakdown mechanism, resulting in even higher values of the collector-emitter breakdown voltage. The floating field regions are fabricated together with the extrinsic base layer by using the same lithography mask, allowing the self-alignment and the best possible control of distances between those regions. All the embodiments can be obtained by the design of the lithography masks and without any additional process steps. Therefore, the high-voltage transistors with wide selectable range of collector-emitter breakdown voltages are integrated to HCBT BiCMOS process at zero additional cost.

TABLE 1

1. J. A. Appels, and H. M. J Vaes, "High Voltage Thin Layer Devices (RESURF Devices)," in *IEDM Tech. Dig.*, 1979, pp. 238-241.
2. H. Kondo, and Y. Yukimoto, "A New Bipolar Transistor—GAT," *IEEE Trans. Electron Devices*, vol. 27, no. 2, pp. 373-379, February 1980.
3. J. Cai, M. Kumar, M. Steigenvalt, H. Ho, K. Schonenberg, K. Stein, H. Chen, K. Jenkins, Q. Ouyang, P. Oldiges, and T. Ning, "Vertical SiGe-Base Bipolar Transistors on CMOS-Compatible SOI Substrate", *BCTM* 2003, pp. 215-218.
4. T. Suligoj et al, U.S. Pat. No. 7,038,249, 2006
5. T. Suligoj, P. Biljanovic, J. K. O. Sin, K. L. Wang. "A New HCBT with a Partially Etched Collector", IEEE Electron Dev. Letters, Vol. 26, No. 3, pp. 200-202, March 2005
6. T. Suligoj, M. Koricic, H. Mochizuki, S. Morita, K. Shinomura and H. Imai, "Horizontal Current Bipolar Transistor With a Single Polysilicon Region for Improved High-Frequency Performance of BiCMOS ICs," in *IEEE Electron Device Lett.*, vol. 31, no. 6, pp. 534-536, June 2010.
7. M. Koričić, T. Suligoj, H. Mochizuki, S. Morita, K. Shinomura, and H. Imai, "Double-Emitter HCBT Structure—A High-Voltage Bipolar Transistor for BiCMOS Integration,", *IEEE Trans. Electron Devices*, vol. 59, no. 12 pp. 3647-3650, December 2012.
8. M. Koričić, J. ilak and T. Suligoj, "Double-Emitter Reduced-Surface-Field Horizontal Current Bipolar Transistor With 36 V Breakdown Integrated in BiCMOS at Zero Cost," in *IEEE Electron Device Lett.*, vol. 36, no. 2, pp. 90-92, February 2015.
9. W. Sung, B. J. Baliga, "A Comparative Study 4500-V Edge Termination Techniques for SiC Devices,", *IEEE Trans. Electron Devices*, vol. 64, no. 4 pp. 1647-1652, April 2017.

The invention claimed is:

1. A horizontal current bipolar transistor comprising:
a substrate having a first conductivity type and defining a wafer plane parallel to said substrate;

an n-hill layer disposed on top of said substrate, having a second conductivity type opposite to said first conductivity type, forming a first metallurgical pn-junction with said substrate; and surrounded by isolating oxide layer;

at least one n+ diffusion layer having said second conductivity type disposed on top of said substrate and adjacent to said n-hill layer;

an intrinsic base layer disposed on top of said n-hill layer and comprising a portion of at least one of two opposing sidewalls inclined at an acute angle to said wafer plane, having said first conductivity type, and forming a second metallurgical pn-junction with said n-hill layer;

an extrinsic base layer disposed on top of said n-hill layer, having said first conductivity type and forming a third metallurgical pn-junction with said n-hill layer and forming a metallurgical p$^+$p junction with said intrinsic base layer;

a field limiting region having said first conductivity type disposed on top of said n-hill layer forming a fourth metallurgical pn-junction with said n-hill layer;

wherein an isometric projection of said extrinsic base layer on said wafer plane not intercepted with an isometric projection of said intrinsic base layer on said wafer plane consists of at least one polygon having a finite area larger than zero;

wherein said field limiting region is separated from said extrinsic base layer by a distance larger than zero;

wherein said field limiting region is separated from said n+ diffusion layer by a distance larger than zero; and wherein said extrinsic base layer and said field limiting region exhibit substantially equal impurity dopant distribution decay towards the substrate.

2. The horizontal current bipolar transistor of claim 1, wherein at least one CMOS pwell layer of said first conductivity type is disposed within said substrate, and wherein at least one MOS type transistor is disposed within said CMOS pwell layer.

3. The horizontal current bipolar transistor of claim 1, characterized by a collector-emitter breakdown voltage,
   wherein for at least one value of collector-emitter voltage smaller than said collector-emitter breakdown voltage, a depletion region extends at least from said third metallurgical pn-junction to said fourth metallurgical pn-junction;
   wherein for at least one value of collector-emitter voltage smaller than said collector-emitter breakdown voltage, a depletion region extends at least from said first metallurgical pn-junction to said second metallurgical pn-junction;
   wherein for at least one value of collector-emitter voltage smaller than said collector-emitter breakdown voltage, a depletion region extends at least from said first metallurgical pn-junction to said third metallurgical pn-junction; and
   wherein for at least one value of collector-emitter voltage smaller than said collector-emitter breakdown voltage, a depletion region extends at least from said first metallurgical pn-junction to said fourth metallurgical pn-junction.

4. The horizontal current bipolar transistor of claim 3, further comprising an anode contact disposed on top of said field limiting region.

5. The horizontal current bipolar transistor of claim 1, wherein an anode contact is disposed on top of said field limiting region.

6. The horizontal current bipolar transistor of claim 5, wherein at least one CMOS pwell layer of said first conductivity type is disposed within said substrate, and wherein at least one MOS type transistor is disposed within said CMOS pwell layer.

7. The horizontal current bipolar transistor of claim 1, additionally comprising:
   an outermost floating field region having said first conductivity type disposed on top of said n-hill layer next to said field limiting region and forming a fifth metallurgical pn-junction with said n-hill layer; and
   optionally, one or more middle floating field regions having said first conductivity type disposed on top of said n-hill layer between said field limiting region and said outermost floating field region and forming additional metallurgical pn-junctions with said n-hill layer;
   wherein said outermost floating field region and said middle floating field regions are separated by a distance larger than zero;
   wherein said outermost floating field region is separated from said n+ diffusion layer by a distance larger than zero; and
   wherein said extrinsic base layer, said field limiting region, said outermost floating field region and said middle floating field regions exhibit substantially equal impurity dopant distribution decay towards the substrate.

8. The horizontal current bipolar transistor of claim 7, wherein at least one CMOS pwell layer of first conductivity type is disposed within said substrate and at least one MOS type transistor is disposed within said CMOS pwell layer.

9. The horizontal current bipolar transistor of claim 7, further characterized by a collector-emitter breakdown voltage,
   wherein for at least one value of collector-emitter voltage smaller than said collector-emitter breakdown voltage, a depletion region extends at least from said third metallurgical pn-junction to said fourth metallurgical pn-junction;
   wherein for at least one value of collector-emitter voltage smaller than said collector-emitter breakdown voltage, a depletion region extends at least from said first metallurgical pn-junction to said second metallurgical pn-junction;
   wherein for at least one value of collector-emitter voltage smaller than said collector-emitter breakdown voltage, a depletion region extends at least from said first metallurgical pn-junction to said third metallurgical pn-junction;
   wherein for at least one value of collector-emitter voltage smaller than said collector-emitter breakdown voltage, a depletion region extends at least from said first metallurgical pn-junction to said fourth metallurgical pn-junction;
   wherein for at least one value of collector-emitter voltage smaller than said collector-emitter breakdown voltage, a depletion region extends at least from said third metallurgical pn-junction to said fifth metallurgical pn-junction; and
   wherein for at least one value of collector-emitter voltage smaller than said collector-emitter breakdown voltage, a depletion region extends at least from said first metallurgical pn-junction to said fifth metallurgical pn-junction.

10. The horizontal current bipolar transistor of claim 9, further comprising an anode contact disposed on top of said field limiting region.

11. The horizontal current bipolar transistor of claim 7, wherein an anode contact is disposed on top of said field limiting region.

12. The horizontal current bipolar transistor of claim 11, wherein at least one CMOS pwell layer of said first conductivity type is disposed within said substrate, and wherein at least one MOS type transistor is disposed within said CMOS pwell layer.

13. A horizontal current bipolar transistor comprising:
a substrate having a first conductivity type and defining a wafer plane parallel to said substrate;
an n-hill layer disposed on top of said substrate, having a second conductivity type opposite to said first conductivity type, and forming a first metallurgical pn-junction with said substrate;
a n+ diffusion layer having said second conductivity type disposed on top of said substrate and adjacent to said n-hill layer and forming a metallurgical n+n junction with said n-hill layer;
an intrinsic base layer disposed on top of said n-hill layer and comprising a portion of a sidewall inclined at an acute angle to said wafer plane, having said first conductivity type, and forming a second metallurgical pn-junction with said n-hill layer;
an extrinsic base layer disposed on top of the n-hill layer, having said first conductivity type and forming a third metallurgical pn-junction with said n-hill layer and forming a metallurgical $p^+p$ junction with said intrinsic base layer;
a field limiting region having said first conductivity type disposed on top of said n-hill layer forming a fourth metallurgical pn-junction with said n-hill layer;
wherein said field limiting region is separated from said extrinsic base layer by a distance larger than zero;
wherein said field limiting region is separated from said n+ diffusion layer by a distance larger than zero; and
wherein said extrinsic base layer and said field limiting region exhibit substantially equal impurity dopant distribution decay towards the substrate.

14. The horizontal current bipolar transistor of claim 13, wherein at least one CMOS pwell layer of said first conductivity type is disposed within said substrate, and wherein at least one MOS type transistor is disposed within said CMOS pwell layer.

15. The horizontal current bipolar transistor of claim 13, further characterized by a collector-emitter breakdown voltage,
wherein for at least one value of collector-emitter voltage smaller than said collector-emitter breakdown voltage, a depletion region extends at least from said third metallurgical pn-junction to said fourth metallurgical pn-junction;
wherein for at least one value of collector-emitter voltage smaller than said collector-emitter breakdown voltage, a depletion region extends at least from said first metallurgical pn-junction to said second metallurgical pn-junction;
wherein for at least one value of collector-emitter voltage smaller than said collector-emitter breakdown voltage, a depletion region extends at least from said first metallurgical pn-junction to said third metallurgical pn-junction; and
wherein for at least one value of collector-emitter voltage smaller than said collector-emitter breakdown voltage, a depletion region extends at least from said first metallurgical pn-junction to said fourth metallurgical pn-junction.

16. The horizontal current bipolar transistor of claim 15, further comprising an anode contact disposed on top of said field limiting region.

17. The horizontal current bipolar transistor of claim 13, wherein an anode contact is disposed on top of said field limiting region.

18. The horizontal current bipolar transistor of claim 17, wherein at least one CMOS pwell layer of first conductivity type is disposed within said substrate and at least one MOS type transistor is disposed within said CMOS pwell layer.

19. The horizontal current bipolar transistor of claim 13, additionally comprising:
an outermost floating field region having said first conductivity type disposed on top of said n-hill layer next to said field limiting region and forming a fifth metallurgical pn-junction with said n-hill layer; and
optionally, one or more middle floating field regions having said first conductivity type disposed on top of said n-hill layer between said field limiting region and said outermost floating field region and forming additional metallurgical pn-junctions with said n-hill layer;
wherein said outermost floating field region and said middle floating field regions are separated by a distance larger than zero;
wherein said outermost floating field region is separated from said n+ diffusion layer by a distance larger than zero; and
wherein said extrinsic base layer, said field limiting region, said outermost floating field region and said middle floating field regions exhibit substantially equal impurity dopant distribution decay towards the substrate.

20. The horizontal current bipolar transistor of claim 19, wherein at least one CMOS pwell layer of said first conductivity type is disposed within said substrate, and wherein at least one MOS type transistor is disposed within said CMOS pwell layer.

21. The horizontal current bipolar transistor of claim 19, further characterized by a collector-emitter breakdown voltage,
wherein for at least one value of collector-emitter voltage smaller than said collector-emitter breakdown voltage, a depletion region extends at least from said third metallurgical pn-junction to said fourth metallurgical pn-junction;
wherein for at least one value of collector-emitter voltage smaller than said collector-emitter breakdown voltage, a depletion region extends at least from said first metallurgical pn-junction to said second metallurgical pn-junction;
wherein for at least one value of collector-emitter voltage smaller than said collector-emitter breakdown voltage, a depletion region extends at least from said first metallurgical pn-junction to said third metallurgical pn-junction;
wherein for at least one value of collector-emitter voltage smaller than said collector-emitter breakdown voltage, a depletion region extends at least from said first metallurgical pn-junction to said fourth metallurgical pn-junction;
wherein for at least one value of collector-emitter voltage smaller than said collector-emitter breakdown voltage, a depletion region extends at least from said third metallurgical pn-junction to said fifth metallurgical pn-junction; and
wherein for at least one value of collector-emitter voltage smaller than said collector-emitter breakdown voltage, a depletion region extends at least from said first metallurgical pn-junction to said fifth metallurgical pn-junction.

22. The horizontal current bipolar transistor of claim 21, further comprising an anode contact disposed on top of said field limiting region.

23. The horizontal current bipolar transistor of claim 19, wherein an anode contact is disposed on top of said field limiting region.

24. The horizontal current bipolar transistor of claim 23, wherein at least one CMOS pwell layer of said first conductivity type is disposed within said substrate, and wherein at least one MOS type transistor is disposed within said CMOS pwell layer.

* * * * *